(12) United States Patent
Burgener et al.

(10) Patent No.: US 8,373,490 B2
(45) Date of Patent: Feb. 12, 2013

(54) METHOD, SYSTEM, AND APPARATUS FOR RF AND DC SWITCHING

(75) Inventors: Mark L. Burgener, San Diego, CA (US); Fleming Lam, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 100 days.

(21) Appl. No.: 12/913,575

(22) Filed: Oct. 27, 2010

(65) Prior Publication Data

US 2012/0105127 A1 May 3, 2012

(51) Int. Cl.
*G06F 7/42* (2006.01)
*G06G 7/14* (2006.01)
(52) U.S. Cl. ........................................ 327/361
(58) Field of Classification Search .............. 327/361
See application file for complete search history.

(56) References Cited

U.S. PATENT DOCUMENTS

| | | | |
|---|---|---|---|
| 3,469,212 A | 9/1969 | Georg et al. | |
| 4,528,517 A | 7/1985 | Schlotzhauer | |
| 5,331,221 A | 7/1994 | Ganesan et al. | |
| 6,762,704 B1 * | 7/2004 | Melanson et al. | 341/143 |
| 7,098,734 B2 * | 8/2006 | Hongo et al. | 330/149 |
| 7,190,222 B2 * | 3/2007 | Okazaki et al. | 330/149 |
| 7,545,216 B2 | 6/2009 | Hamley | |
| 7,602,227 B2 * | 10/2009 | Kim et al. | 327/359 |
| 7,609,109 B2 * | 10/2009 | Arisawa | 329/311 |
| 7,920,026 B2 * | 4/2011 | Hughes | 330/255 |
| 2001/0013814 A1 * | 8/2001 | Arisawa | 332/115 |
| 2002/0171486 A1 | 11/2002 | Krupnik | |
| 2003/0090313 A1 | 5/2003 | Burgener et al. | |
| 2005/0068102 A1 * | 3/2005 | Hongo et al. | 330/149 |
| 2005/0195030 A1 * | 9/2005 | Okazaki et al. | 330/149 |
| 2006/0006955 A1 * | 1/2006 | Arisawa | 332/149 |
| 2006/0220747 A1 * | 10/2006 | Kiji | 330/308 |
| 2007/0229156 A1 | 10/2007 | Alenin et al. | |
| 2007/0243849 A1 | 10/2007 | Prikhodko et al. | |
| 2008/0166984 A1 * | 7/2008 | Shie et al. | 455/201 |
| 2008/0246543 A1 | 10/2008 | Trifonov et al. | |
| 2009/0174495 A1 * | 7/2009 | Arisawa | 332/115 |
| 2009/0251215 A1 * | 10/2009 | Hughes | 330/255 |
| 2012/0049956 A1 | 3/2012 | Lam | |
| 2012/0086512 A1 * | 4/2012 | Sharma et al. | 330/278 |
| 2012/0105127 A1 * | 5/2012 | Burgener et al. | 327/361 |
| 2012/0148001 A1 * | 6/2012 | Yashima | 375/344 |

FOREIGN PATENT DOCUMENTS

WO    WO2012058122    5/2012

OTHER PUBLICATIONS

Nguyen, Khanh V., Office Action received from the USPTO dated Apr. 5, 2012 for related U.S. Appl. No. 12/807,365, 10 pgs.
Ghilini, Marie, International Search Report and Written Opinion received from the EPO dated Apr. 16, 2012 for related appln. No. PCT/US2011/057381, 11 pgs.
Nguyen, Khanh V., Office Action received from the USPTO dated Nov. 4, 2011 for related U.S. Appl. No. 12/807,365, 14 pgs.
Peregrine Semiconductor Corporation, Demand filed in the EPO dated Aug. 24, 2012 for related appln. No. PCT/US2011/057381, 24 pgs.

(Continued)

*Primary Examiner* — Adam Houston
(74) *Attorney, Agent, or Firm* — Jaquez & Associates; Martin J. Jaquez, Esq.; Merle W. Richman, Esq.

(57) ABSTRACT

Embodiments of RF and DC switching are described generally herein. Other embodiments may be described and claimed.

20 Claims, 7 Drawing Sheets

OTHER PUBLICATIONS

Nguyen, Khanh V., Notice of Allowance received from the USPTO dated Sep. 6, 2012 for related U.S. Appl. No. 12/807,365, 13 pgs.

Ratajski, Andre, Written Opinion of the International Preliminary Examining Authority received from the EPO dated Oct. 18, 2012 for related appln. No. PCT/US2011/057381, 6 pgs.

* cited by examiner

METHOD, SYSTEM, AND APPARATUS FOR RF AND DC SWITCHING

TECHNICAL FIELD

Various embodiments described herein relate generally to switching, including systems, and methods used in audio to radio frequency (RF) switching.

BACKGROUND INFORMATION

It may be desirable to pass signals having a range of frequency content including audio, radio, mid, and baseband frequencies, the present invention provides a system, method, and apparatus for same.

DETAILED DESCRIPTION

Figure 1A:
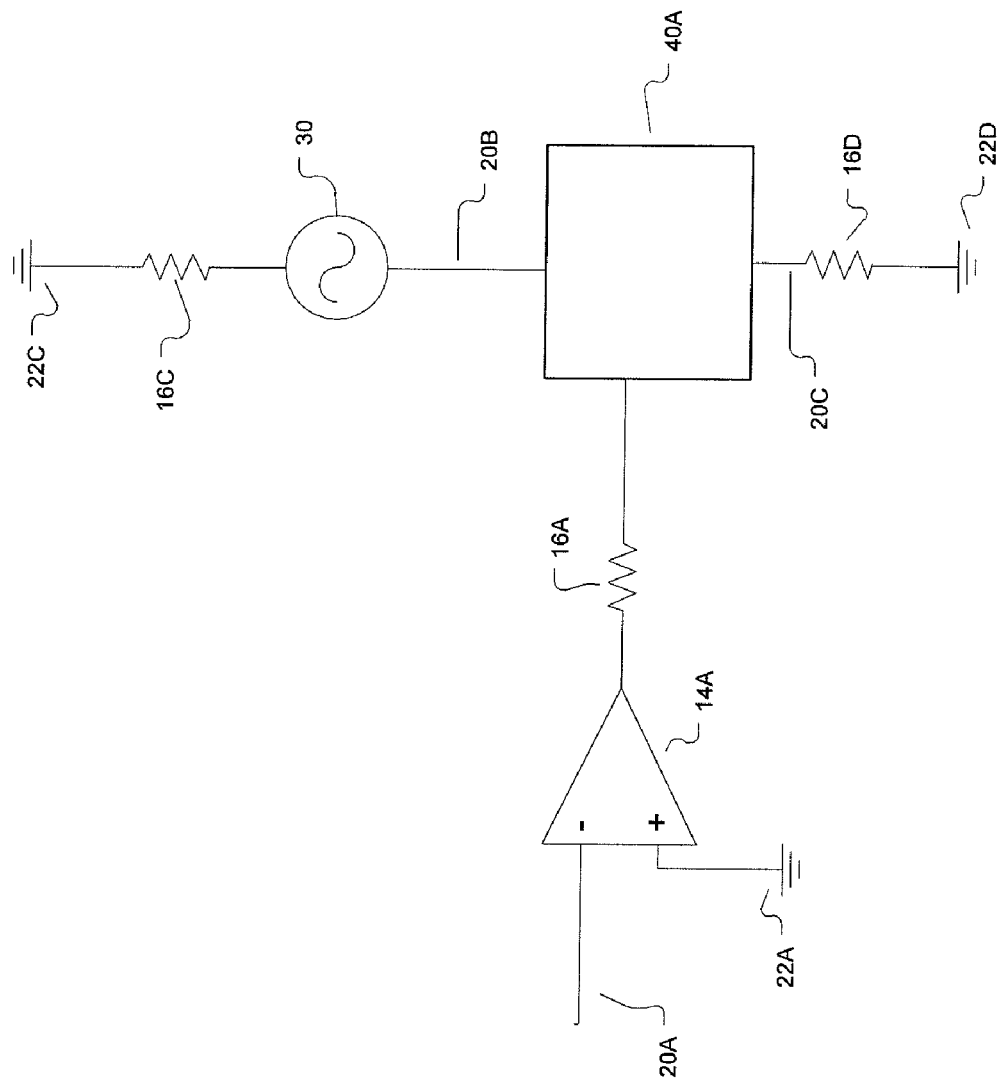
FIG. 1A is a block diagram of a signal processing system according to various embodiments.

FIG. 1A is a block diagram of a signal processing system 10A according to various embodiments. As shown in FIG. 1A, the system 10A includes a an operational amplifier (OP-AMP) module 14A, resistors 16A, 16C, and 16D, frequency signal generator module 30, and a controllable module 40A. The frequency signal generator module 30 may generate signals including various frequencies from audio to radio frequency (RF). The combination of the op-amp 14A and resistor 16A may amplify the control or bias signal 20A. The controllable module 40A may process the signal 20B based on the amplified bias signal 20A. The module 40A processed signal 20C may be read across resistor 16D.

Figure 1B:
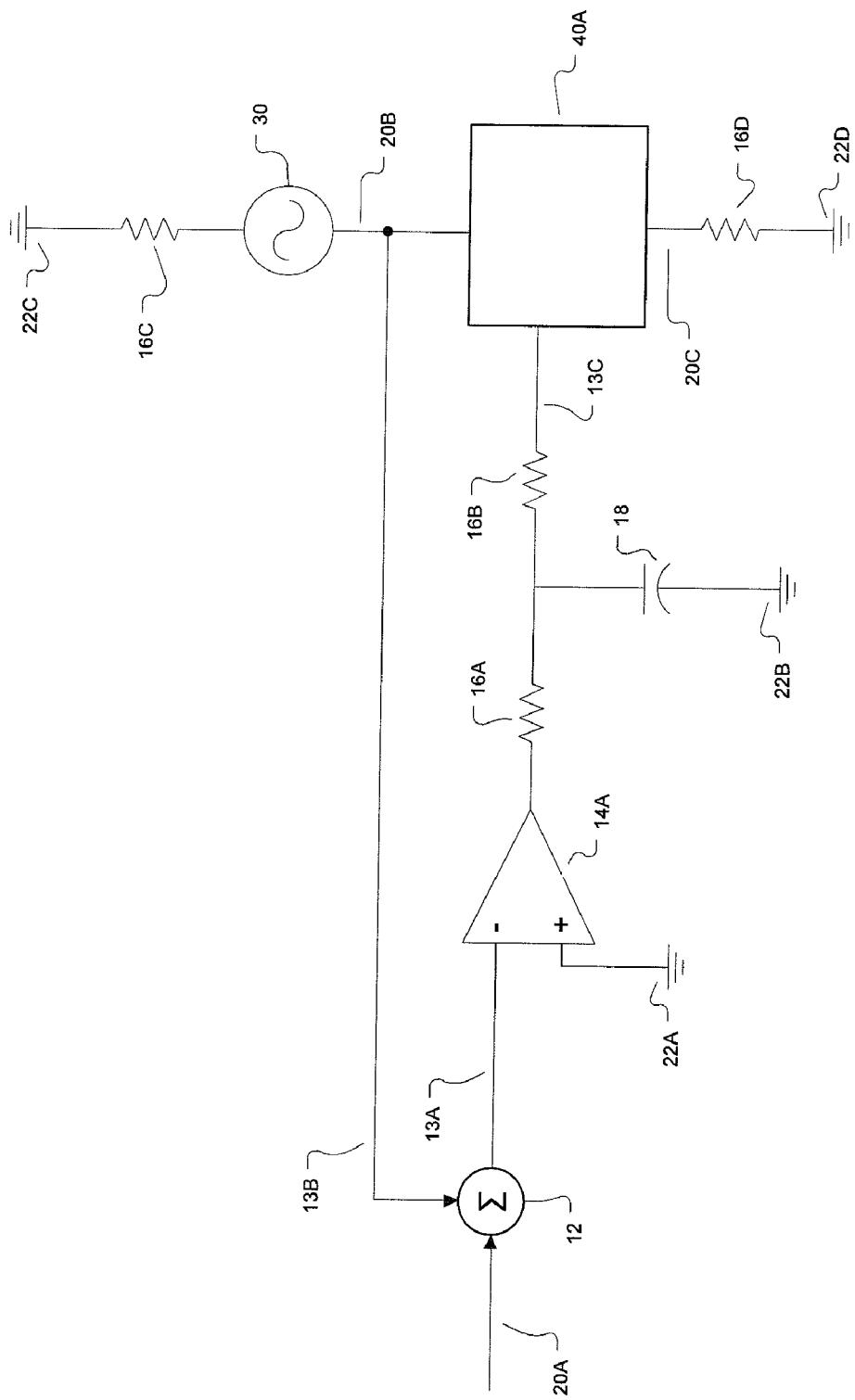
FIG. 1B is a block diagram of another signal processing system according to various embodiments.
Figure 1C:
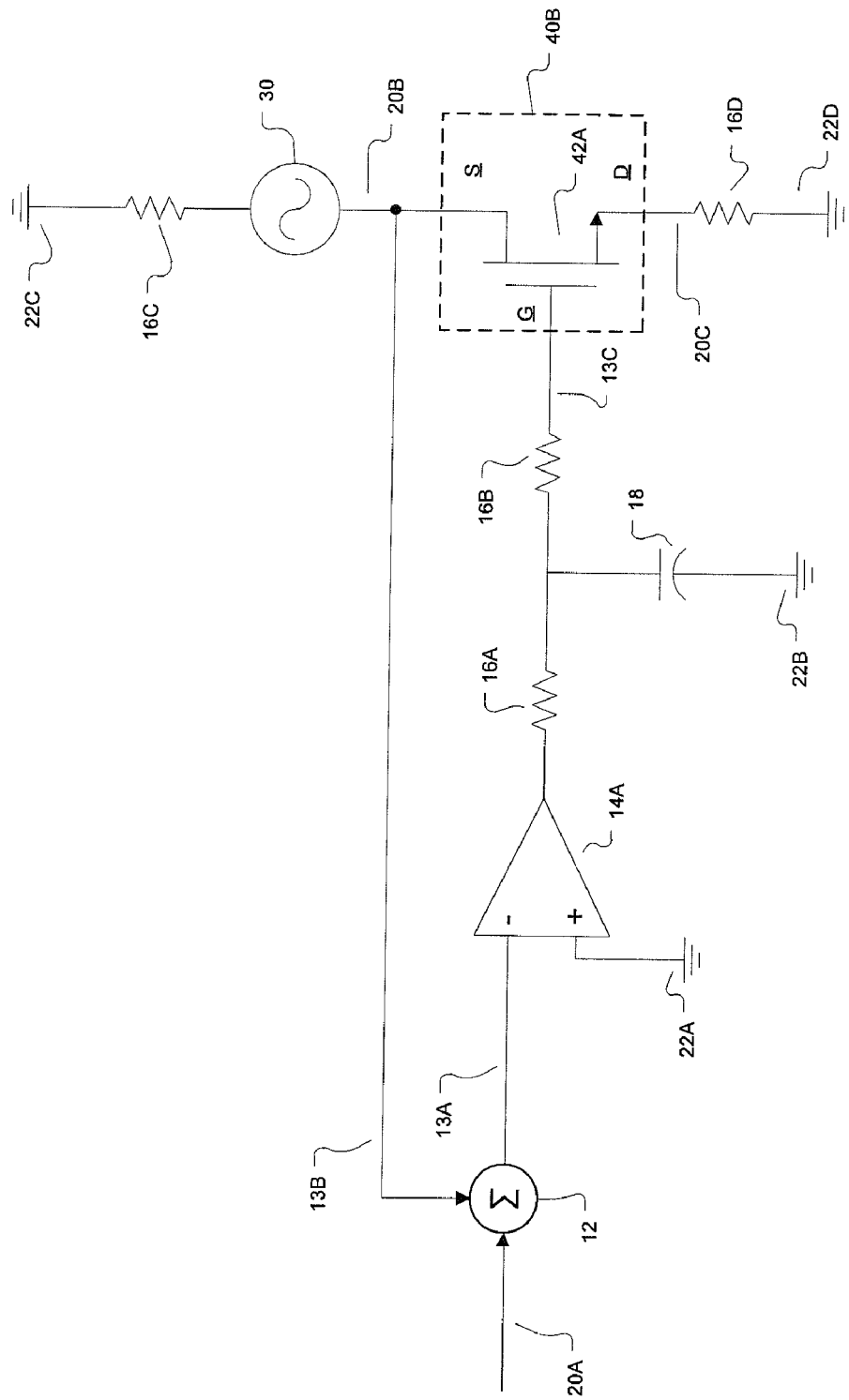
FIG. 1C is a block diagram of another signal processing system according to various embodiments.
Figure 1D:
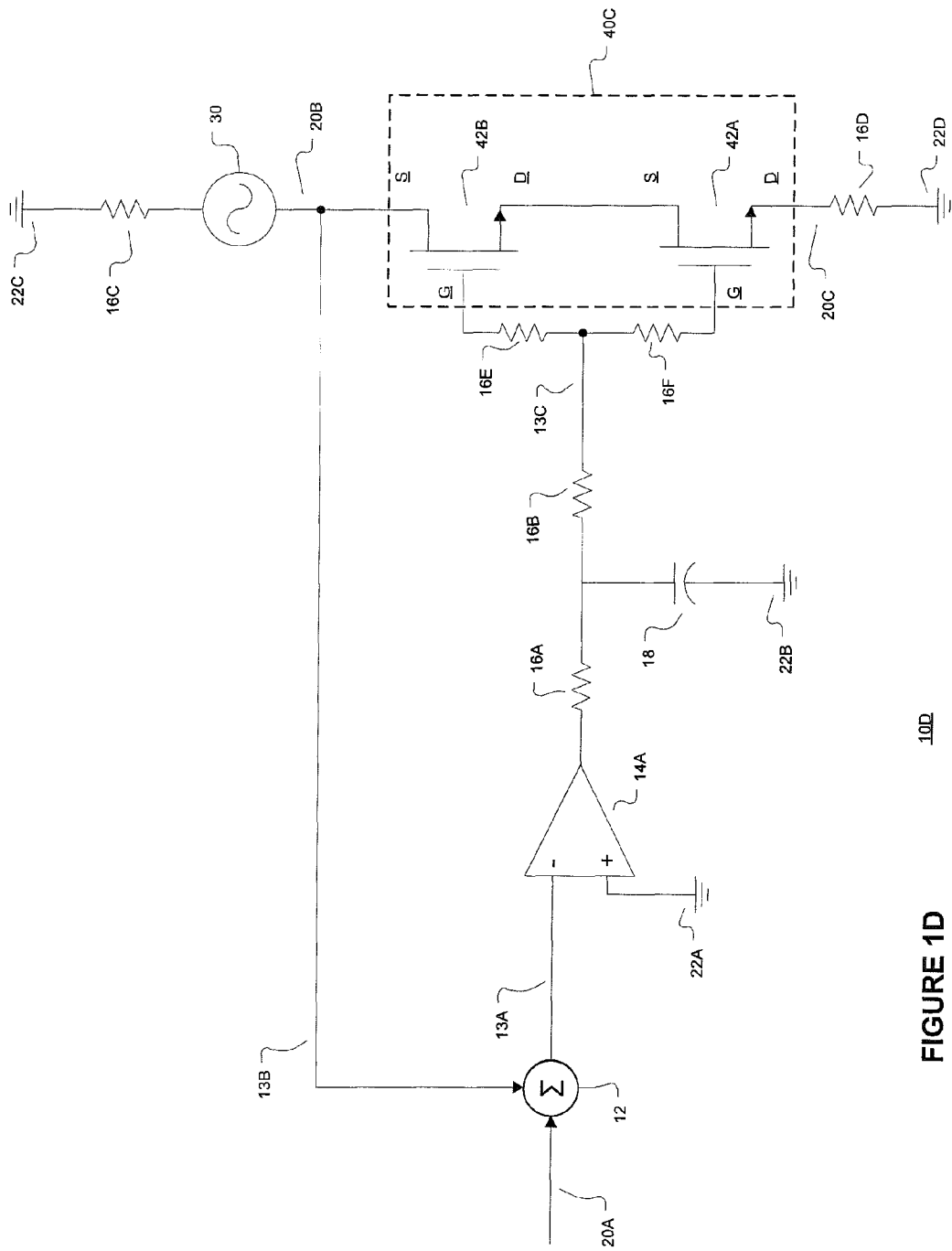
FIG. 1D is a block diagram of another signal processing system according to various embodiments.
Figure 2A:
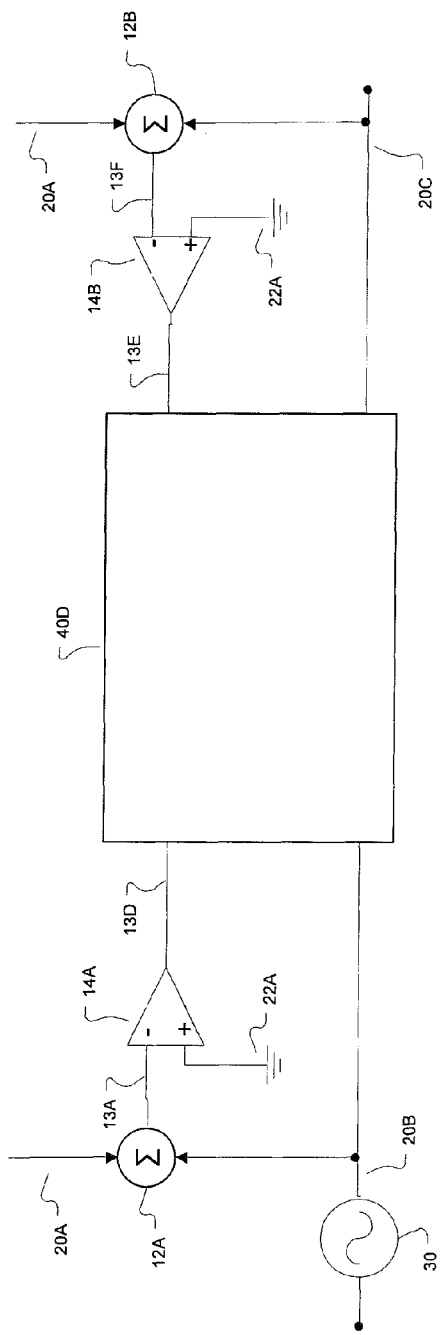
FIG. 2A is a block diagram of a signal processing system according to various embodiments.
Figure 2B:
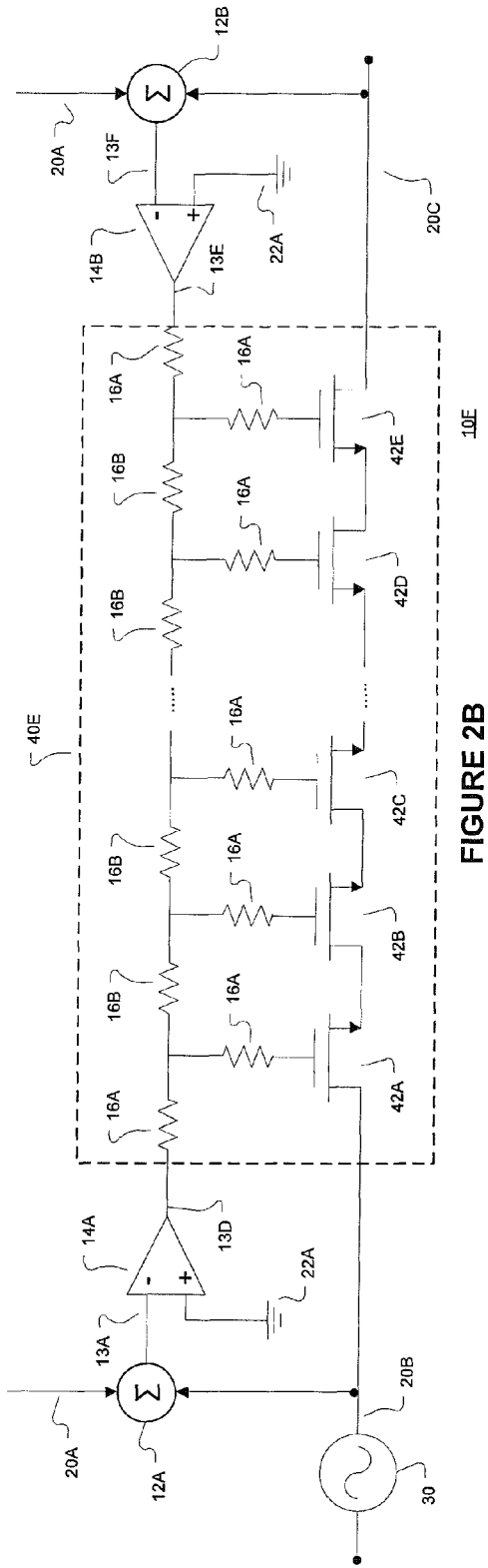
FIG. 2B is a block diagram of another signal processing system according to various embodiments.
Figure 2C:
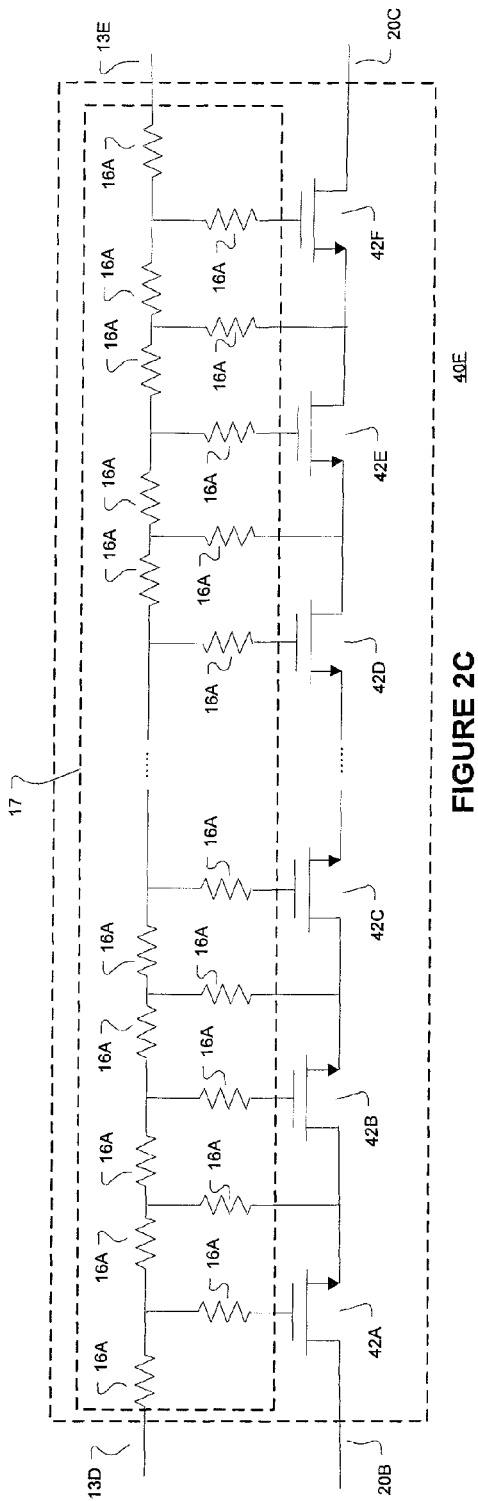
FIG. 2C is a block diagram of a segment of a signal processing system according to various embodiments.

In an embodiment, the signal processing module 40A may include one or more controllable elements (such as a n-type complementary metal-oxide-semiconductor N-CMOS transistor shown in FIG. 1C, two N-CMOS transistors shown in FIG. 1D, or a plurality of N-CMOS transistors shown in FIGS. 2B and 2C). Various controllable elements may include a capacitive effect, which may distort a signal 20B including lower frequency components. In an embodiment, the frequency signal 20B may be distorted by the module 40A elements (42A in FIG. 1C) as a function of the bias signal 20A and the frequency content of the frequency signal 20B applied to the module 40A. Further, a direct current (DC) bias may also be applied to the signal 20B. The module 40A may further distort the frequency signal 20B content or components when a DC bias signal is applied to the signal 20B.

FIG. 1B is a block diagram of a signal processing system 10B according to various embodiments. As shown in FIG. 1B, the system 10B includes a summer 12, an operational amplifier (OP-AMP) module 14A, resistors 16A, 16B, 16C, and 16D, a capacitor 18, a frequency signal generator module 30, and a controllable module 40A. The frequency signal generator module 30 may generate signals including various frequencies from audio to radio frequency (RF). A summer module 12 may combine the bias signal 20A with the frequency signal 20B. The op-amp module 14A may amplify the combined signal 13A. The resistors 16A, 16B and capacitor 18 form a filter to attenuate components of the amplified, combined signal 13A.

The controllable module 40A may process the signal 20B based on the filtered, amplified, combined signal 13C. The module 40A processed signal 20C may be read across resistor 16D. In an embodiment the resistors 16A and 16B may be about 10 K ohms, the resistors 16C and 16D may be about 50 ohms, and the capacitor may be about 1.5 pF. While the summer module 12 and op-amp 14A module may introduce a delay and or gain, the circuit module formed by the resistors 16A, 16B and capacitor 18 may modify the delay and gain for optimal performance over frequency. The system 10B may enable the signal 20B to be processed by the controllable module 40A with little distortion to lower frequency or DC components of the signal 20B.

FIG. 1C is a block diagram of a signal processing system 10C according to various embodiments. As shown in FIG. 1C, the system 10C includes a summer 12, an operational amplifier (OP-AMP) module 14A, resistors 16A, 16B, 16C, and 16D, a capacitor 18, a frequency signal generator module 30, and a controllable module 40B. In an embodiment the controllable module 40B includes N-CMOS transistor 42A. The transistor 42A source (S) is coupled to the signal generator module 30 to receive the signal 20B. The transistor 42A gate (G) is coupled to the resistor 16A, 16B, capacitor 18 circuit module to receive the filtered, amplified, combined bias signal 13C. The transistor 42A drain (D) is coupled to the resistor 16D to provide the processed frequency signal 20C.

The transistor 42A may modulate or switch the signal 20B received on its source as a function of the filtered, amplified, combined signal 13C received on the gate as understood by one skilled in the art. The module 40B processed signal 20C may be read across resistor 16D. In an embodiment the resistors 16A and 16B may be about 10 K ohms, the resistors 16C and 16D may be about 50 ohms, and the capacitor may be about 1.5 pF. The system 10C may enable the signal 20B to be processed by transistor 42A with little distortion to lower frequency or DC components of the signal 20B.

FIG. 1D is a block diagram of a signal processing system 10D according to various embodiments. As shown in FIG. 1D, the system 10D includes a summer 12, an operational amplifier (OP-AMP) module 14A, resistors 16A, 16B, 16C, 16D, 16E, and 16F, a capacitor 18, a frequency signal generator module 30, and a controllable module 40C. In an embodiment the controllable module 40C includes two, stacked N-CMOS transistor 42A, 42B. A N-CMOS transistor 42A voltage conduction level may be limited, in an embodiment to about 3 volts. The module 40C may include multiple transistors 42A, 42B to increase the power or voltage handling limit of the system 10D. In an embodiment the system 10D may be able to process signals 20D having a voltage level of about 6 volts.

The transistor 42B source (S) may be coupled to the signal generator module 30 to receive the signal 20B. The transistor 42A and 42B gates (G) may be coupled to the resistor 16A, 16B, capacitor 18 circuit module via the resistors 16E, 16F respectfully to receive the filtered, amplified, combined bias signal 13C. The transistor 42B drain (D) may be coupled to the transistor 42A source to communicate the frequency signal 20C. The transistor 42A drain (D) may be coupled to the resistor 16D to provide the processed frequency signal 20C.

The transistors 42A, 42B may modulate or switch the signal 20B received on its source, directly or indirectly as a function of the filtered, amplified, combined signal 13C received on their respective gates as understood by one skilled in the art. The module 40B processed signal 20C may be read across resistor 16D. In an embodiment the resistors 16A and 16B may be about 10 K ohms, the resistors 16C 16D, 16E, and 16F may be about 50 ohms, and the capacitor may be about 1.5 pF. The system 10D may enable a higher voltage signal 20B to be processed by transistors 42A, 42B with little distortion to lower frequency or DC components of the signal 20B.

FIG. 2A is a block diagram of a signal processing system 10E according to various embodiments. As shown in FIG. 2A, the system 10E includes a summer 12A, a summer 12B, an operational amplifier (OP-AMP) module 14A, an operational amplifier (OP-AMP) module 14B, a frequency signal generator module 30, and a controllable module 40D. The frequency signal generator module 30 may generate signals including various frequencies from baseband to radio frequency (RF). The summer module 12A may combine the bias signal 20A with the frequency signal 20B. The op-amp module 14A may amplify the combined signal 13A to provide an amplified, combined signal 13D to the controllable module 40D. The summer module 12B may combine the bias signal 20A with a processed frequency signal 20C. The op-amp module 14B may amplify the combined signal 13F to provide an amplified, combined signal 13E to the controllable module 40D.

The controllable module 40D may process the signal 20B based on both the amplified, combined signal 13D and the amplified, combined signal 13E to generate a processed frequency signal 20C. The signals 13D, 13E provide a balanced bias or control signal to the module 40D. The system 10E may enable the signal 20B to be processed by the controllable module 40D with little distortion to lower frequency or DC components of the signal 20B.

FIG. 2B is a block diagram of a signal processing system 10F according to various embodiments. As shown in FIG. 2B, the system 10F includes a summer 12A, a summer 12B, an operational amplifier (OP-AMP) module 14A, an operational amplifier (OP-AMP) module 14B, a frequency signal generator module 30, and a controllable module 40E. The frequency signal generator module 30 may generate signals including various frequencies from audio to radio frequency (RF). The summer module 12A may combine the bias signal 20A with the frequency signal 20B. The op-amp module 14A may amplify the combined signal 13A to provide an amplified, combined signal 13D to the controllable module 40E. The summer module 12B may combine the bias signal 20A with a processed frequency signal 20C. The op-amp module 14B may amplify the combined signal 13F to provide an amplified, combined signal 13E to the controllable module 40E.

The module 40E may include multiple transistors 42A, 42B, 42C, 42D, 42E to increase the power or voltage handling limit of the system 10D. In an embodiment the system 10D may be able to process signals 20B having a voltage level of about (3 times the number of transistors) volts. In an embodiment the amplified, combined signals 13D, 13E may be evenly distributed to the gates of the group of transistors 42A, 42B, 42C, 42D, 42E via the resistors 16A, 16B. In an embodiment the ohm value of resistor 16B is twice the ohm value of resistor 16A. The system 10E, 10F may reduce current leakage across the transistors 42A, 42B, 42C, 42D, 42E and equalize the voltage division across the transistors 42A, 42B, 42C, 42D, 42E.

In the embodiment a transistor 42A source (S) may be coupled to the signal generator module 30 to receive the signal 20B. Transistor 42A through 42E gates (G) may be coupled to the resistors 16A, 16B circuit module to receive the amplified, combined bias signals 13D, 13E. The transistor 42B, 42C, 42D, 42E drain (D) may be coupled to the transistor 42A, 42A, 42B, 42C, 42D source, respectively to communicate the frequency signal 20B. The transistor 42E drain (D) may be coupled to the summer 12B to provide the processed frequency signal 20C.

The transistors 42A, 42B, 42C, 42D, 42E of module 40E may modulate or switch the signal 20B received on its source, directly or indirectly as a function of the amplified, combined signals 13D, 13E received on their respective gates as understood by one skilled in the art. In an embodiment the resistors 16A may be about 10 K ohms and resistors 16B may be about 20 K ohms. The system 10D may enable a high voltage signal 20B to be processed by transistors 42A, 42B, 42C, 42D, 42E with little distortion to lower frequency or DC components of the signal 20B. Accordingly, the controllable module 40E may process the signal 20B based on both the amplified, combined signal 13D and the amplified, combined signal 13E to generate a processed frequency signal 20C. The signals 13D, 13E provide a balanced bias or control signal to the module 40E.

FIG. 2C is a block diagram of a controllable module 40F that may be employed in a system 10E, 10F of FIG. 2A, 2B respectively according to various embodiments. As shown in FIG. 2C the module 40F may include multiple transistors 42A, 42B, 42C, 42D, 42E, 42F coupled to a resistor circuit module. The resistor circuit module includes resistors 16A that equally couple signals 13D and 13E to the gates of the transistors 42A, 42B, 42C, 42D, 42E, 42F. As above, the use of a plurality of transistors increases the power or voltage handling limit of the controllable module 40F. In an embodiment, the controllable module 40F may be able to process signals 20B having a voltage level of about (3 times the number of transistors) volts.

In an embodiment the amplified, combined signals 13D, 13E may be evenly distributed to the gates of the group of transistors 42A, 42B, 42C, 42D, 42E via the resistors 16A circuit module 17. The resistor circuit module 17 includes taps between the drain and source of each adjacent pair of transistors 42A, 42B, 42C, 42D, 42E. The controllable module 40F may reduce current leakage across the transistors 42A, 42B, 42C, 42D, 42E and equalize the voltage division across the transistors 42A, 42B, 42C, 42D, 42E.

In the embodiment a transistor 42A source (S) receive the signal 20B. Transistor 42A through 42F gates (G) may be coupled to the resistors 16A of the circuit module 17 to receive the amplified, combined bias signals 13D, 13E. The transistor 42B, 42C, 42D, 42E, 42F drain (D) may be coupled to the transistor 42A, 42A, 42B, 42C, 42D, 42F source, respectively to communicate the frequency signal 20B. The transistor 42F drain (D) may provide the processed frequency signal 20C.

The transistors 42A, 42B, 42C, 42D, 42E 42F of module 40F may modulate or switch the signal 20B received on its source, directly or indirectly as a function of the amplified, combined signals 13D, 13E received on their respective gates as understood by one skilled in the art. In an embodiment the resistors 16A may be about 10 K. The controllable module 40F may enable a high voltage signal 20B to be processed by transistors 42A, 42B, 42C, 42D, 42E, 42F with little distortion to lower frequency or DC components of the signal 20B. Accordingly, the controllable module 40F may process the signal 20B based on both the amplified, combined signal 13D and the amplified, combined signal 13E to generate a processed frequency signal 20C.

In an embodiment the systems 10B to 10F may be employed as a switch to control or limit the passage of the frequency signal 20B except during desired time intervals. The systems 10B to 10F may be employed in an RF transmitter to insert a desired frequency signal 20B in one or more communication slots. Due to the reduction of capacitance of the system 10B to 10F, the guard time required to insert a desired signal in a desired time slot may be reduced.

Figure 3A:
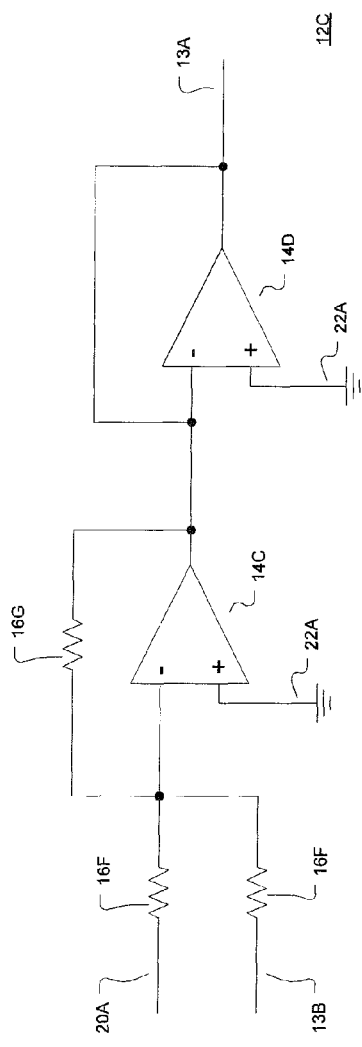
FIG. 3A is a block diagram of a summing apparatus according to various embodiments.
Figure 3B:
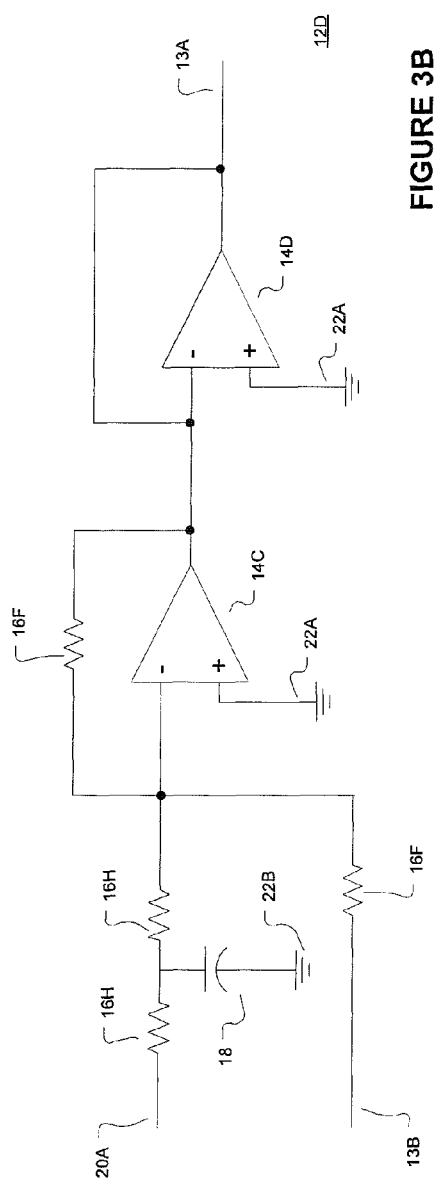
FIG. 3B is a block diagram of another summing apparatus according to various embodiments.
Figure 3C:
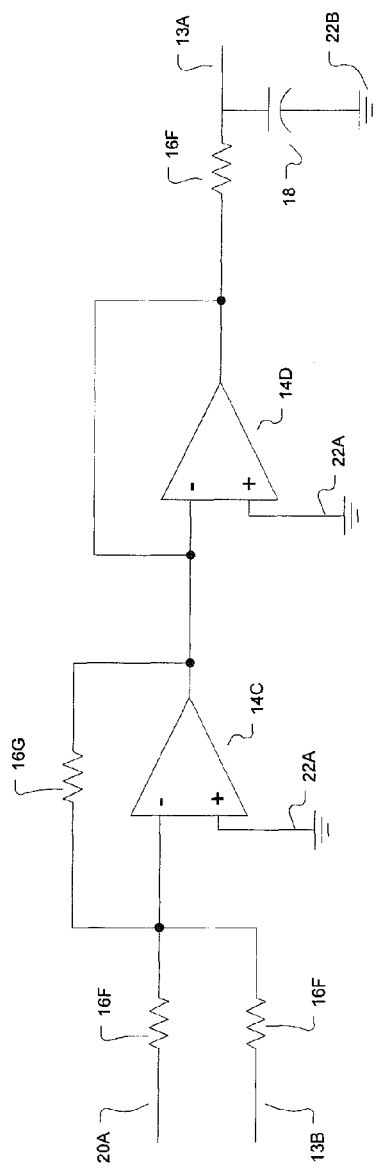
FIG. 3C is a block diagram of another summing apparatus according to various embodiments.

FIG. 3A to 3C are block diagram of summer modules 12C, 12D, 12E, respectfully that may be employed in a system 10B to 10F according to various embodiments. Summer module 12C shown in FIG. 3A includes resistors 16F, 16G, and op-amps 14C, 14D. A first signal 20A and a second signal 13B are summed via resistors 16F and then amplified via op-amps 14C, 14D. The gain of the input signals 20A, 13B to the output signal 13A is equal to the ratio of the resistor 16G to the resistor 16F (their ohm values). In an embodiment resistors 16F ohm value is similar to the resistor 16G ohm value.

The summing module 12D of FIG. 3B is similar to the summing module 12C of FIG. 3A. The summing module 12D further includes an additional resistor 16H and capacitor 18 circuit module on the input 20A of the op-amp 14C. Such a configuration may delay the response of the summing module 12D. The summing module 12E of FIG. 3C is also similar to the summing module 12C of FIG. 3A. The summing module 12E of FIG. 3C further includes a resistor 16F and capacitor 18 circuit module on the output 13A. The summing module 12E of FIG. 3C may overshoot the input signals 20A, 13B. Summing modules 12C, 12D, 12E may be employed in systems 10B to 10F based on the desired response of the systems 10B to 10F.

In an embodiment the op-amps 14A, 14B, 14C, 14D may include a balanced set of N-type and P-type CMOS transistors as described on co-pending and commonly assigned U.S. patent application Ser. No. 12/807,365 entitled "Amplifiers and Related Biasing Methods and Devices", filed Sep. 1, 2010, Attorney Docket PER-040, which is hereby incorporated by reference.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus for generating a second signal from a first signal based on a bias signal, including:
a first summing module for summing the bias signal to the first signal to generate a first bias signal;
a second summing module for summing the bias signal to the second signal to generate a second bias signal; and
a controllable signal processing module, the module receiving the first signal, the first bias signal, and the second bias signal and generating the second signal from the first signal based the combination of the first bias signal and the second bias signal, the controllable signal processing module including a capacitive effect.

2. The apparatus for generating a second signal from a first signal based on a bias signal of claim 1, further including a first amplifier for amplifying the first bias signal and the controllable signal processing module receiving the first signal, the amplified first bias signal, and the second bias signal and generating the second signal from the first signal based the combination of the amplified first bias signal and the second bias signal.

3. The apparatus for generating a second signal from a first signal based on a bias signal of claim 2, further including a second amplifier for amplifying the second bias signal and the controllable signal processing module receiving the first signal, the amplified first bias signal, and the amplified second bias signal and generating the second signal from the first signal based the combination of the amplified first bias signal and the amplified second bias signal.

4. The apparatus for generating a second signal from a first signal based on a bias signal of claim 1, the controllable signal processing module including a CMOS transistor, the transistor including a gate, source, and a drain and the combination of the first bias signal and the second bias signal received at the gate, the first signal received on the source, and the second signal generated on the drain.

5. The apparatus for generating a second signal from a first signal based on a bias signal of claim 1, the first signal including an RF component.

6. The apparatus for generating a second signal from a first signal based on a bias signal of claim 5, the first signal further including a baseband component.

7. The apparatus for generating a second signal from a first signal based on a bias signal of claim 5, the first signal further including a DC component.

8. The apparatus for generating a second signal from a first signal based on a bias signal of claim 1, the controllable signal processing module including a plurality of CMOS transistors, each transistor including a gate, source, and a drain and the combination of the first bias signal and the second bias signal received at the gate of each transistor.

9. The apparatus for generating a second signal from a first signal based on a bias signal of claim 1, the controllable signal processing module including a plurality of CMOS transistors, each transistor including a gate, source, and a drain and the combination of the first bias signal and the second bias signal approximately equally received at the gate of each transistor.

10. The apparatus for generating a second signal from a first signal based on a bias signal of claim 3, wherein the apparatus is an RF switch and the controllable signal processing modulates the first signal to generate the second signal based on the combination of the amplified first bias signal and the amplified second bias signal.

11. The apparatus for generating a second signal from a first signal based on a bias signal of claim 1, the controllable signal processing module including a plurality of CMOS transistors and a plurality of resistors, each transistor including a gate, source, and a drain and the combination of the first bias signal and the second bias signal received at the gate of each transistor via at least one resistor.

12. The apparatus for generating a second signal from a first signal based on a bias signal of claim 1, the controllable signal processing module including a plurality of CMOS transistors and a plurality of resistors, each transistor including a gate, source, and a drain and the combination of the first bias signal and the second bias signal approximately equally received at the gate of each transistor via at least one resistor.

13. An method for generating a second signal from a first signal based on a bias signal, including:
summing the bias signal to the first signal to generate a first bias signal;
summing the bias signal to the second signal to generate a second bias signal; and
at a controllable signal processing module receiving the first signal, the first bias signal, and the second bias signal and generating the second signal from the first signal based the combination of the first bias signal and the second bias signal, the controllable signal processing module including a capacitive effect.

14. The method for generating a second signal from a first signal based on a bias signal of claim 13, further including amplifying the first bias signal and at controllable signal processing module receiving the first signal, the amplified first bias signal, and the second bias signal and generating the second signal from the first signal based the combination of the amplified first bias signal and the second bias signal.

15. The method for generating a second signal from a first signal based on a bias signal of claim 14, further amplifying the second bias signal and at the controllable signal processing module receiving the first signal, the amplified first bias signal, and the amplified second bias signal and generating the second signal from the first signal based the combination of the amplified first bias signal and the amplified second bias signal.

16. The method for generating a second signal from a first signal based on a bias signal of claim 13, wherein the controllable signal processing module includes a CMOS transistor, the transistor including a gate, source, and a drain and receiving the combination of the first bias signal and the second bias signal at the gate, the first signal received on the source, and the second signal generated on the drain.

17. The method for generating a second signal from a first signal based on a bias signal of claim 13, the first signal including an RF component.

18. The method for generating a second signal from a first signal based on a bias signal of claim 17, the first signal further including a baseband component.

19. The method for generating a second signal from a first signal based on a bias signal of claim 17, the first signal further including a DC component.

20. The method for generating a second signal from a first signal based on a bias signal of claim 13, the controllable signal processing including a plurality of CMOS transistors, each transistor including a gate, source, and a drain and receiving the combination of the first bias signal and the second bias signal at the gate of each transistor.

* * * * *